US006295626B1

(12) United States Patent
Nair et al.

(10) Patent No.: US 6,295,626 B1
(45) Date of Patent: Sep. 25, 2001

(54) SYMBOL BASED ALGORITHM FOR HARDWARE IMPLEMENTATION OF CYCLIC REDUNDANCY CHECK

(75) Inventors: Rajesh G. Nair, San Jose; Gerry Ryan, Mountain View; Farivar Farzaneh, Los Altos, all of CA (US)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/176,055

(22) Filed: Oct. 20, 1998

Related U.S. Application Data

(60) Provisional application No. 60/062,923, filed on Oct. 20, 1997.

(51) Int. Cl.[7] .......................... H03M 13/09; H03M 13/15
(52) U.S. Cl. ............................................ 714/807; 714/757
(58) Field of Search ........................................ 714/807, 757

(56) References Cited

U.S. PATENT DOCUMENTS 5,132,975 * 7/1992 Avaneas ................ 371/37.6
5,282,215 * 1/1994 Hyodo et al. ........... 371/42
5,774,480 * 6/1998 Willy .................... 371/37.1
5,905,664 * 5/1999 Ko et al. ................ 364/746

OTHER PUBLICATIONS

Helness, "Implementation of a parallel Cyclic Redundancy Check Generator", Computer Design, Mar. 1974, pp. 91–96, Mar. 1974.*

Pei et al., "High–Speed Parallel CRC Circuits in VLSI", IEEE Trans. on Communications, vol. 40, No. 4, Apr. 1992, pp. 653–657, Apr. 1992.*

* cited by examiner

*Primary Examiner*—Stephen M. Baker
(74) *Attorney, Agent, or Firm*—Blakely Sokoloff Taylor & Zafman LLP

(57) ABSTRACT

A method and apparatus for generation of CRC generation/checker circuitry. A symbolic simulation-based algorithm to derive boolean equations for a parameterizable data-width CRC generator/checker is described. The equations generated are used to implement a data-flow representation of the CRC circuit in VHDL. The VHDL description is then synthesized into gates.

35 Claims, 2 Drawing Sheets

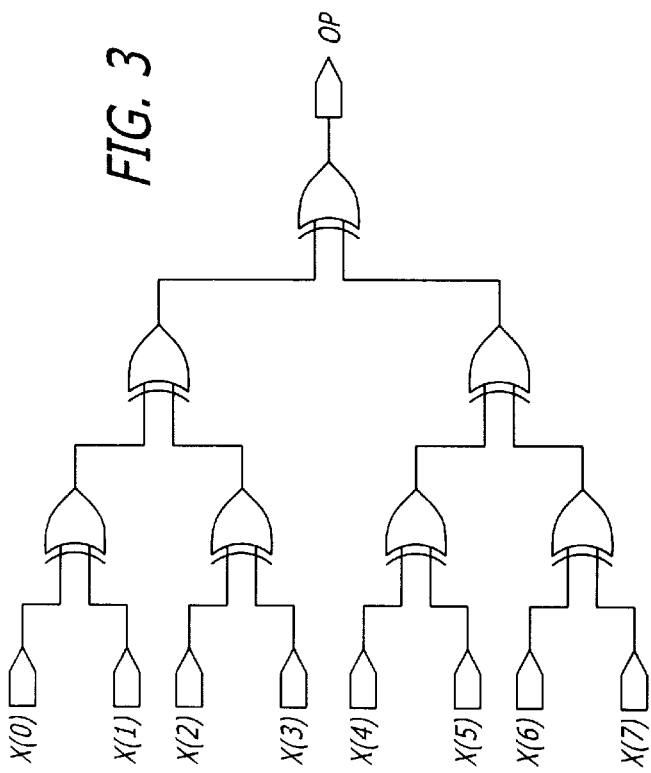

FIG. 3

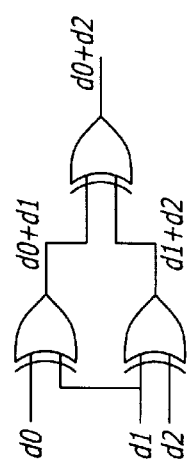

FIG. 4

```
for i in 0 to size loop   --size=width of CRC
    --compute value for register 0
    Next_CRC_VAL(0) :=CRC_VAL(31)XOR DATA(i);
        j:=0;
    --compute values for registers 1 through 31
    for k in 1 to 31 loop
        j:=j+1;
        case j is
            when 1|2|4|5|7|8|10|11|12|16|22|23|26 =>
                --these registers are on the feedback path
                Next_CRC_VAL(j):=CRC_VAL(j-1) XOR CRC_VAL(31) XOR DATA(i);
            when others=>
                --these registers are not on the feedback path
                Next_CRC_VAL(j):=CRC_VAL(j-1);
        end case;
    end loop;

CRC_VAL:= Next_CRC_VAL;

end loop;
```

FIG. 5

SYMBOL BASED ALGORITHM FOR HARDWARE IMPLEMENTATION OF CYCLIC REDUNDANCY CHECK

RELATED APPLICATIONS

This application claims benefit of co-pending U.S. provisional application Ser. No. 60/062,923 titled Symbol Based Algorithm for Hardware Implementation of Cyclic Redundancy Check filed Oct. 20, 1997.

BACKGROUND OF THE INVENTION

1. Field of the Invention

The present invention relates to the field circuit design and, more specifically to design of circuits for calculating cyclic redundancy check (CRC) codes.

2. Description of the Related Art

Cyclic redundancy check (CRC) codes have many uses. In computer networking, for example, a CRC code is a very powerful tool and easily implemented technique to obtain data reliability in networking. The CRC technique is used to verify the integrity of blocks of data called Frames. Using this technique, the transmitter appends an extra n bit sequence to every frame called Frame Check Sequence (FCS). FCS holds redundant information about the frame that helps the receiver detect errors in the frame. CRC is one of the most commonly used techniques for error detection in data communications.

One known hardware implementation of a bit-wide CRC generator is a simple linear feedback shift register (see FIG. 1.). For example, FIG. 1 illustrates a bit wide CRC generator for the polynominal $G(x)=1+X+X^3+X^5$. While such a circuit is simple and can run at very high clock speeds, it suffers from the limitation that the stream must be bit-serial. This means that n clock cycles will be required to calculate the CRC values for an n-bit data stream. In many high speed data networking applications where data frames need to be processed at high speeds this latency is intolerable and hence, implementation of CRC generation and checking on a parallel stream of data becomes desirable.

A byte-wide CRC generator can be implemented to generate CRC for an 8-bit wide data stream in one clock cycle as opposed to 8 clock cycles with a conventional CRC generator (and, other width CRC generators can be implemented for other width data streams). In addition, several software implementations have been proposed to compute the CRC for a multi-bit data stream. See, e.g., Perez et al., *Byte wise CRC calculations,* IEEE Micro. 3(3):40–50 June, 1983 and Pandeya et al., *Parallel CRC lets many lines use one circuit,* Computer Design, 14(9):87–91, September, 1975.

SUMMARY OF THE INVENTION

A symbolic simulation based algorithm to derive boolean equations for a parameterizable data width CRC generator/checker is described. The equations generated are used to implement a data flow representation of the CRC circuit in VHDL. The VHDL description is then synthesized into gates.

BRIEF DESCRIPTION OF THE DRAWINGS

FIG. 3 illustrates a balanced tree implementation of the same XOR function as illustrated in FIG. 2 (Maximum logic levels=3)

FIG. 4 illustrates a symbolic simulation result for a simple exclusive-or tree.

FIG. 5 illustrates a snapshot of the loop iteration to derive register values for CRC-32

DETAILED DESCRIPTION OF THE EMBODIMENTS THE PRESENT INVENTION

An n-bit CRC generator can be described in a hardware description language (HDL) by using a loop construct to loop through the whole n-bits of data, one bit at a time, updating the CRC in each iteration. After n iterations, the CRC registers will hold the required CRC value. As will be described, the description can be synthesized to yield a circuit that can compute an n-bit CRC in a single clock cycle.

Figure 1:
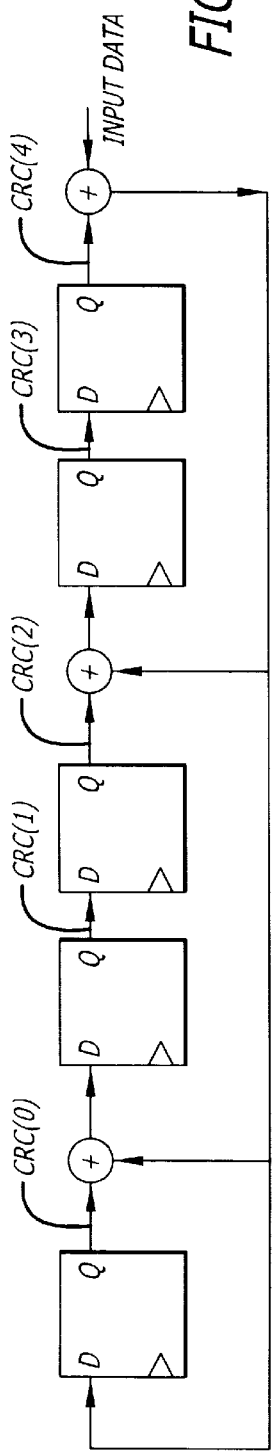
FIG. 1 illustrates a bit wide CRC generator for the polynomial $G(x)=1+X+X^3+X^5$.
Figure 2:
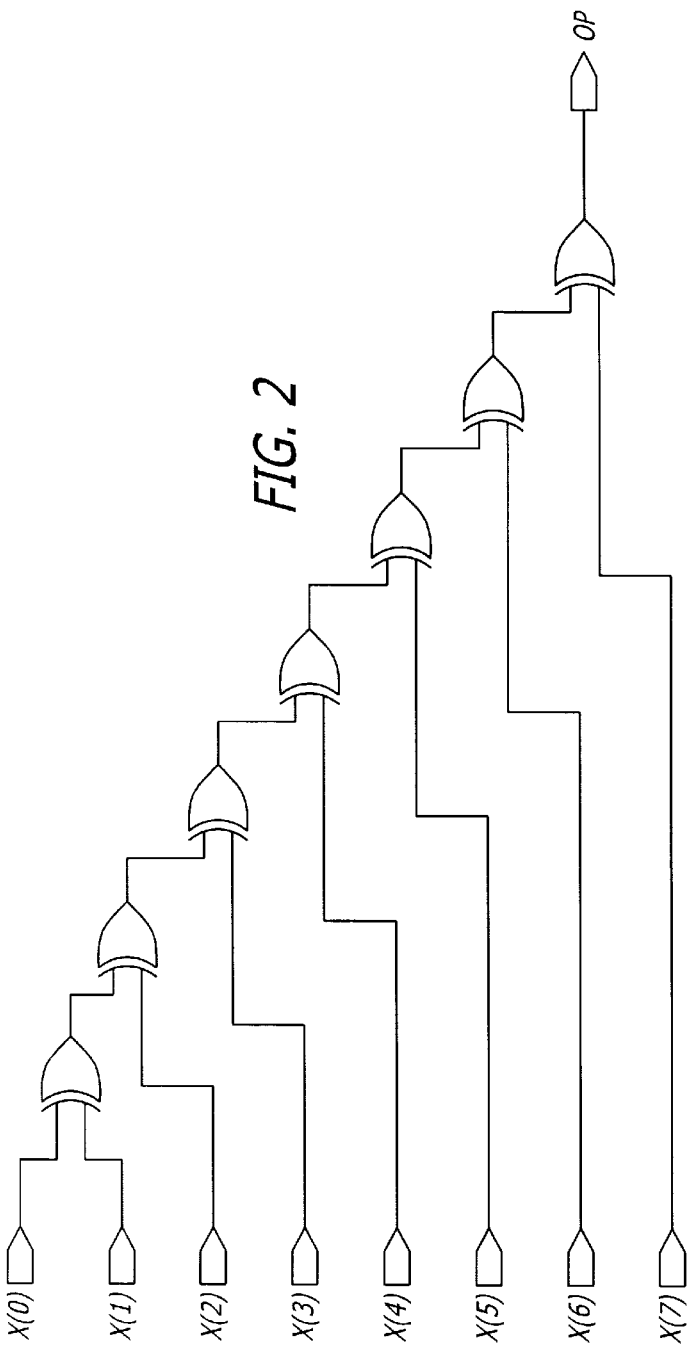
FIG. 2 iillustrates a ripple implementation of an XOR tree (Maximum number of logic levels=7)

This first embodiment of the present invention provides adequate timing results in synthesis for values of n less than or equal to 16. In embodiments where n is greater than 16, this synthesis is not fully effective for at least two reasons:

1. Due to the loop unrolling that takes place in RTL synthesis, the for-loop construct translates to a ripple implementation in gates and hence there could be up to n-levels of logic in the synthesis implementation for a loop of depth n (see FIG. 2). For example, FIG. 2 illustrates a ripple implementation of an XOR tree, with a maximum number of logic levels =7. This leads to a very slow timing path. By giving tight timing constraints for synthesis, the number of levels of logic can be reduced but our experiments show that for values of n greater than 16, the timing obtained through synthesis gets significantly worse than what could be achieved using a balanced tree implementation. (see FIG. 3). For instance, FIG. 3 illustrates a balanced tree implementation of the same XOR function as illustrated in FIG. 2, but with a maximum number of logic levels =3.

2. Synthesis does not remove all the redundancies in the expression for each of the CRC register bits. The Boolean expression for CRC gets larger after each iteration through the loop. However, it may also contain redundancies which are not removed efficiently by synthesis.

CRC Algorithms

In describing CRC, the data stream is represented as a binary polynomial, m(D), with coefficients $m_{K-1}, m_{K-2}, \ldots, m_0$ where K is the length of the data stream (see, e.g., *Hardware Design and VLSI Implementation of a Byte-wise CRC generator Chip,* IEEE Transactions on Consumer Electronics, 41(1):195–200, February, 1995).

$$m(D)=m_{K-1}D^{K-1}+m_{K-2}D^{K-2}+ \ldots +m_0 \quad (1)$$

The CRC is similarly represented by the polynomial $$C(D)=C_{L-1}D^{L-1}+ \ldots +C_1D+C_0 \quad (2)$$

where L is the length of the CRC. The frame to be transmitted (the data stream with the CRC appended to it) can be represented as:

$$F(D)=m(D)D^L+C(D) \quad (3)$$

The CRC polynomial C(D) is defined in terms of a generator polynomial g(D) which is a polynomial of degree L with binary coefficients that specify the particular CRC code to be used. If we divide $m(D)D^L$ by $g(D)$, the remainder obtained is the CRC polynomial, i.e., $$C(D)=\text{remainder }[m(D)D^L/g(D)] \quad (4)$$

Let $q(D)$ be the quotient resulting from dividing $m(D)D^L$ by $g(D)$. Then we have $$m(D)D^L=g(D)q(D)+c(D) \quad (5)$$

Subtracting C(D) modulo-2 from both sides of the above equation and recognizing the fact that modulo-2 addition and subtraction are the same we get $$m(D)D^L+C(D)=g(D)q(D) \quad (6)$$

Hence all the code words are divisible by g(D) and all polynomials divisible by g(D) are code words. C(D) is of degree at most L−1.

The CRC algorithm calculates C(D) and appends it to the data stream being sent. At the receiver, the message (with CRC appended) is divided by the generator polynomial g(D). if the remainder is zero it is assumed that there are no errors in the received message or the errors have gone undetected due to one valid code word being erroneously converted to another. The probability of such an occurrence is $2^L$. If however, the remainder is non-zero, the message is declared to be in error. There are various generator polynomials in use. The most common are:

CRC-12: $D^{12}+D^{11}+D^3+D^2+D+1$

CRC-16: $D^{16}+D^{15}+D^2+1$

CRC-CCITT: $D^{16}+D^{12}+D^5+1$

CRC-32: $D^{32}+D^{26}+D^{23}+D^{22}+D^{16}+D^{12}+D^{11}+D^{10}+D^8+D^7+D^5+D^4+D^2+D+1$

The properties of the CRC-32 polynomial are discussed in Hammond et al., *Development of a Transmission Error Model and an Error Control Model,* Technical Report RADC-TR-75-138, Rome Air Development Center (1975).

Algorithm Description

Described below is our proposed technique to derive the Boolean expressions for the bits of the CRC register. The technique is based on symbolic simulation. The idea here is to use symbols instead of binary values and simulate a behavioral description of the circuit using these symbols. The n-bit wide data stream is represented as a set of symbols (d0, d1, d2 . . . dn−1). The initial values of the CRC registers are also represented symbolically (i0, i1, i2 . . . i31). We represent a logical exclusive-or (XOR) operation as a concatenation (using "+") of the symbols. This works very well for the CRC generator as XOR is the only logical operation performed on the data stream bits.

To illustrate how symbolic simulation works, the result of symbolic simulation of a simple XOR tree structure is shown in FIG. 4. The advantages of this method are two fold. First, by running a symbolic simulation for the CRC generator, we are able to generate a set of equations for each of the CRC registers as a function of the data stream and the initial value of the CRC register. Secondly, it is possible to inspect the equations to remove any redundancies in the expression. For e.g., if the expression for a CRC register bit was calculated to be d0+d1+d1+d2, where d0,d1,d2 are the input data stream and the symbol "+" represents a logical XOR operation, then the output expression can be reduced to the form d0+d2, since d1 XOR d1 equals 0 (involution).

Our proposed technique involves modifying a behavioral description of a parameterizable width CRC based on the loop iteration technique (discussed above and further illustrated in FIG. 5 for register values for CRC-32) to implement a symbolic simulation of the circuit. Using this technique, we loop through the whole stream of data, one bit at a time, calculating the symbolic expression for CRC in each iteration. Upon completing the loop iterations, we obtain the Boolean expression for each of the CRC register bits. The Boolean expression of XOR operations is then passed through a recursive function call (see *VHDL Coding Guidelines for High Performance: Quick Reference Guide Version* 1.0, pgs 25–27, Technical Manual, Synopsys Inc. 1997) to implement a balanced tree implementation of the expression.

Implementation of an Embodiment of the Present Invention

First, a behavioral loop iteration scheme is implemented for the CRC-32 polynomial. The loop iteration scheme calculates the CRC value iteratively over a complete stream of data. FIG. 5 gives a snapshot of the loop iteration for CRC-32(VHDL code). The variable DATA represents the data stream, CRC_VAL holds the value from the previous iteration and Next_CRC_VAL holds the new value of CRC after each iteration. Conventionally, this loop iteration scheme is synthesized to obtain the CRC circuit.

We implement symbolic simulation based on this loop iteration scheme by using string data types in place of the binary signals for the variables DATA, CRC_VAL and Next_CRC_VAL. In place of the XOR operation of two binary inputs, the input strings are concatenated to form the resultant string. As an example, we will illustrate the symbolic simulation of the following VHDL statement.

Next_CRC_VAL(0):=CRC_VAL(31)XOR DATA(i);

Let us assume that the current symbolic simulation string for CRC_VAL(31) equals "i(002)+d(002)+i(029)" where "+" denotes the XOR operation, i(m) denotes the initial value of CRC register m and d(n) represents the $n^{th}$ bit of the data stream d. Also assume DATA(i) holds the value d(010) ($10^{th}$ data bit in the data stream). Then the new value of Next_CRC_VAL(0) after symbolic simulation will be:

"i(002)+d(002)+i(029)+d(010)"

which is essentially a concatenation of the two input strings for the expression for Next_CRC_VAL(0). After each iteration through the loop, we perform redundancy removal in the newly evaluated string. This is accomplished by a function call that removes any redundancies using the involution property of the XOR operation.

The only input to the program is an integer representing the size of the data stream. After the symbolic simulation, using VHDL File I/O techniques, the program outputs a set of equations for each of the 32 register bits for the CRC-32 polynomial. When outputting the set of equations the "+" symbol is replaced with the keyword "XOR" and we also make sure that the equation is written out in a valid VHDL format. The equation output from the CRC generator will only have XOR operations due to the nature of the CRC polynomial. These equations are then substituted in place of the loop construct in the behavioral description of the CRC to get a data flow implementation of the CRC generator.

Once we have the data flow VHDL description, we use a recursive function call to build a balanced XOR tree for each of the equations. The balanced XOR tree gives superior results to the ripple implementation (see FIG. 2 and FIG. 3.). This can then be synthesized to gates to obtain the required hardware.

The program can be modified for other CRC generator polynomial by changing the loop indices and the feedback registers.

ALTERNATIVES TO THE DESCRIBED EMBODIMENT OF THE PRESENT INVENTION

There are, of course, alternatives to the described embodiment which are within the reach of one of ordinary skill in the relevant art. The present invention is intended to be limited only by the claims presented below.

Thus, what has been disclosed is a method and apparatus for development of a CRC generator/checker.

What is claimed is:

1. A method of generating boolean expressions for a cyclic redundancy check circuit comprising:
    a) generating a loop iteration to provide symbolic simulation of a circuit;
    b) executing the loop iteration for each bit of a data stream to calculate a symbolic expression for a cyclic redundancy check in each iteration;
    c) generating a boolean expression for each symbolic expression; and
    d) generating circuit definition language for the boolean expressions.

2. The method as recited in claim 1 wherein the circuit definition language generates a ripple tree implementation of the expressions.

3. The method as recited by claim 1 wherein the circuit definition language generates a balanced tree implementation of the expressions.

4. The method as recited by claim 3 wherein the balanced tree has greater than 8 inputs.

5. The method as recited by claim 3 wherein the balanced tree has 16 inputs.

6. The method as recited by claim 3 wherein the balanced tree has 32 inputs.

7. The method as recited in claim 3 wherein the balanced tree comprises a plurality of XOR gates.

8. An apparatus to generate boolean expressions for a cyclic redundancy check circuit comprising:
    a) means for generating a loop iteration to provide symbolic simulation of a circuit;
    b) means for executing the loop iteration for each bit of a data stream to calculate a symbolic expression for a cyclic redundancy check in each iteration;
    c) means for generating a boolean expression for each symbolic expression; and
    d) means for generating circuit definition language for the boolean expressions.

9. The apparatus of claim 8, wherein the means for generating circuit definition language generates a ripple tree implementation of the expressions.

10. The apparatus of claim 8 wherein the means for generating circuit definition language generates a balanced tree implementation of the expressions.

11. The apparatus of claim 10 wherein the balanced tree has greater than 8 inputs.

12. The apparatus of claim 10 wherein the balanced tree has 16 inputs.

13. The apparatus of claim 10 wherein the balanced tree has 32 inputs.

14. The apparatus of claim 10 wherein the balanced tree comprises a plurality of XOR gates.

15. A machine-readable medium comprising at least one instruction to generate boolean expressions for a cyclic redundancy check circuit, which when executed by a processor, causes the processor to perform operations comprising:
    a) generating a loop iteration to provide symbolic simulation of a circuit;
    b) executing the loop iteration for each bit of a data stream to calculate a symbolic expression for a cyclic redundancy check in each iteration;
    c) generating a boolean expression for each symbolic expression; and
    d) generating circuit definition language for the boolean expressions.

16. The machine-readable medium of claim 15 wherein the means for generating circuit definition language generates a ripple tree implementation of the expressions.

17. The machine-readable medium of claim 15 wherein generating circuit definition language generates a balanced tree implementation of the expressions.

18. The machine-readable medium of claim 17 wherein the balanced tree has greater than 8 inputs.

19. The machine-readable medium of claim 17 wherein the balanced tree has 16 inputs.

20. The machine-readable medium of claim 17 wherein the balanced tree has 32 inputs.

21. The machine-readable medium of claim 17 wherein the balanced tree comprises a plurality of XOR gates.

22. A signal for generating boolean expressions for a cyclic redundancy check circuit comprising:
    a) a first source code segment to generate a loop iteration to provide symbolic simulation of a circuit;
    b) a second source code segment to execute the loop iteration for each bit of a data stream to calculate a symbolic expression for a cyclic redundancy check in each iteration;
    c) a third source code segment to generate a boolean expression for each symbolic expression; and
    d) a fourth source code segment to generate circuit definition language for the boolean expressions.

23. The signal of claim 22 wherein the fourth source code to generate circuit definition language generates a ripple tree implementation of the expressions.

24. The signal of claim 22 wherein the fourth source code to generate circuit definition language generates a balanced tree implementation of the expressions.

25. The signal of claim 24 wherein the balanced tree has greater than 8 inputs.

26. The signal of claim 24 wherein the balanced tree has 16 inputs.

27. The signal of claim 24 wherein the balanced tree has 32 inputs.

28. The signal of claim 24 wherein the balanced tree comprises a plurality of XOR gates.

29. A system to generate boolean expressions for a cyclic redundancy check circuit comprising:
    a) a first sub-system to generate a loop iteration to provide symbolic simulation of a circuit;
    b) a second sub-system to execute the loop iteration for each bit of a data stream to calculate a symbolic expression for a cyclic redundancy check in each iteration;
    c) a third sub-system to generate a boolean expression for each symbolic expression; and
    d) a fourth sub-system to generate circuit definition language for the boolean expressions.

30. The system of claim 29 wherein the fourth sub-system to generate circuit definition language generates a ripple tree implementation of the expressions.

31. The system of claim 29 wherein the fourth sub-system to generate circuit definition language generates a balanced tree implementation of the expressions.

32. The system of claim 31 wherein the balanced tree has greater than 8 inputs.

33. The system of claim 31 wherein the balanced tree has 16 inputs.

34. The system of claim 31 wherein the balanced tree has 32 inputs.

35. The system of claim 31 wherein the balanced tree comprises a plurality of XOR gates.

* * * * *